US012063771B2

(12) United States Patent
Lu et al.

(10) Patent No.: US 12,063,771 B2
(45) Date of Patent: Aug. 13, 2024

(54) MEMORY STRUCTURE AND METHOD OF FORMING THEREOF

(71) Applicant: NANYA TECHNOLOGY CORPORATION, New Taipei (TW)

(72) Inventors: Tseng-Fu Lu, New Taipei (TW); Chuan-Lin Hsiao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 167 days.

(21) Appl. No.: 17/651,068

(22) Filed: Feb. 15, 2022

(65) Prior Publication Data
US 2023/0262958 A1   Aug. 17, 2023

(51) Int. Cl.
*H10B 12/00* (2023.01)
*H01L 21/762* (2006.01)
*H01L 29/06* (2006.01)

(52) U.S. Cl.
CPC ......... *H10B 12/315* (2023.02); *H01L 21/762* (2013.01); *H01L 29/0649* (2013.01); *H10B 12/03* (2023.02); *H10B 12/482* (2023.02); *H10B 12/488* (2023.02)

(58) Field of Classification Search
CPC ............... H01L 21/762; H01L 29/0649; H01L 29/4236; H10B 12/03; H10B 12/053; H10B 12/315; H10B 12/34; H10B 12/482; H10B 12/488
See application file for complete search history.

(56) References Cited

U.S. PATENT DOCUMENTS

| 6,197,110 B1* | 3/2001 | Lee ........................ C30B 7/005 414/936 |
| 9,704,988 B2 | 7/2017 | Oh |
| 10,497,704 B2 | 12/2019 | Lin et al. |
| 11,056,175 B1* | 7/2021 | Ikeda .................. G11C 11/4023 |
| 2009/0224312 A1* | 9/2009 | Taketani ............. H10B 12/056 438/270 |
| 2010/0237408 A1* | 9/2010 | Lee ................... H01L 29/66621 257/302 |
| 2013/0306982 A1* | 11/2013 | Kudou .............. H01L 21/28008 438/589 |

FOREIGN PATENT DOCUMENTS

TW    I701805 B    8/2020

* cited by examiner

*Primary Examiner* — Michelle Mandala
*Assistant Examiner* — Kevin Quinto
(74) *Attorney, Agent, or Firm* — CKC & Partners Co., LLC

(57) ABSTRACT

A memory structure includes a substrate, a first word line and a first word line. The substrate has a plurality of active areas and an isolation structure surrounding the active areas. The first word line trench is formed across a first active area of the active areas and the isolation structure. The first word line trench includes a first slot and a first groove. The first slot is recessed from a top surface of the substrate. The first groove expands from a bottom of the first slot. A first sidewall is connected between the bottom of the first slot and a top of the first groove. A first word line is formed in the first word line trench. The first word line comprises a gate dielectric confomally formed on the first groove and the first slot.

13 Claims, 16 Drawing Sheets

MEMORY STRUCTURE AND METHOD OF FORMING THEREOF

BACKGROUND

Field of Invention

The present disclosure relates to memory structures and method of forming a memory structure.

Description of Related Art

In advance memory technology, the retention performance is dominated by lots kinds of leakage effect. The gate induced drain leakage (GIDL) is one of the main contributions for retention. For example, high off state electric field induces worst GIDL and causes worst retention time in a memory device. Furthermore, a small landing area would cause high cell contact resistance and easy to introduce unexpected overlap issue, thereby also cause worst retention performance for a memory device.

Therefore, how to reduce GIDL and landing areas to improve the retention performance for a memory device are the subjects to be solved for the industry.

SUMMARY

An aspect of the present disclosure is related to a memory structure.

According to one embodiment of the present disclosure, a memory structure includes a substrate, a first word line and a first word line. The substrate has a plurality of active areas and an isolation structure surrounding the active areas. The first word line trench is formed across a first active area of the active areas and the isolation structure. The first word line trench includes a first slot and a first groove. The first slot is recessed from a top surface of the substrate. The first groove expands from a bottom of the first slot. A first sidewall is connected between the bottom of the first slot and a top of the first groove. A first word line is formed in the first word line trench. The first word line includes a gate dielectric confomally formed on the first groove and the first slot.

In one or more embodiments of the present disclosure, the first sidewall is inclined with respect to a top surface of the substrate.

In one or more embodiments of the present disclosure, a thickness of the gate dielectric on the first sidewall is greater than a thickness of the gate dielectric on the first slot and the first groove.

In one or more embodiments of the present disclosure, a top portion of the first active area is implanted as a source/drain implant region and the source/drain implant region overlaps the first groove of the first word line trench.

In some embodiments, the first sidewall of the first word line trench in the first active area is a portion of the source/drain implant region.

In one or more embodiments of the present disclosure, the memory structure further includes a second word line and a bit line structure. The second word line is formed across the first active area and the isolation structure. The bit line structure is formed on a portion of the first active area between the first word line and the second word line.

In one or more embodiments of the present disclosure, the memory structure further includes a third word line and a capacitor structure. The third word line is formed across a second active area of the active areas and the isolation structure. The capacitor structure is formed on a portion of the first active area between the first word line and the third word line.

In one or more embodiments of the present disclosure, the first word line further includes a gate structure and a dielectric cap. The agate structure is formed over the gate dielectric and filled with the first groove and the bottom of the first slot. The dielectric cap is filled with the first slot and covering the gate structure.

An aspect of the present disclosure is related to a memory structure.

According to one embodiment of the present disclosure, a memory structure includes a substrate, a plurality of word lines, a bit line structure and a capacitor structure. The substrate has a plurality of active areas and an isolation structure surrounding the active areas. Each of the word lines has an extending bottle-shape on a cross-section perpendicular to a first direction in which the word lines extended along. The word lines include a first word line, a second word line and a third word line. The first word line and the second word line are formed across a first active area of the active areas and the isolation structure. The third word line is formed across a second active area of the active areas and the isolation structure. The bit line structure is formed on a portion of the first active area between the first word line and the second word line. The capacitor structure is formed on a portion of the first active area between the first word line and the third word line.

In one or more embodiments of the present disclosure, the word lines are formed in a plurality of word line trenches extended along the first direction. Each of the word line trenches includes a slot, a groove and a sidewall. The slot of each of the word line trenches is extended from a top surface of the substrate. The groove of each of the word line trenches expands from a bottom the corresponding slot, wherein a width of the corresponding slot on the cross-section is less than a width of the groove on the cross-section. The sidewall of each of the word line trenches is connected between the bottom of the corresponding slot and a top of the corresponding groove.

In some embodiments, the sidewalls of the word line trenches are parallel to the first direction and inclined with respect to the top surface of the substrate.

In some embodiments, each of the word lines formed in the word line trenches includes a gate dielectric conformally formed on the slot, the groove and the sidewall of a corresponding one of the word line trenches. A thickness of the gate dielectric on the sidewall of the corresponding word line trench is greater than a thickness of the gate dielectric on the slot or the groove of the corresponding word line trench.

In some embodiments, the gate dielectrics on the sidewalls of the word line trenches in the active areas include oxidized material of the active areas. The gate dielectrics on the sidewalls of the word line trenches in isolation structure include oxidized material of the isolation structure.

An aspect of the present disclosure is related to a method of forming a memory structure.

According to one embodiment of the present disclosure, a method of forming a memory structure includes following operations. A hard mask is formed on a plurality of active areas and an isolation structure surrounding the active areas of a substrate, wherein the hard mask has a first patterned trench extended over a first active area of the active areas and the isolation structure. The first active area and the isolation structure are etched based on the first patterned trench of the hard mask to form a first slot within the first active area and the isolation structure. A selective layer is formed and overlaps the active areas, the isolation structure and the first slot. A portion of the selective layer at a bottom of the first slot is etched, so that the first active area and the isolation structure at the bottom of the first slot are exposed. The first active area and the isolation structure exposed from the bottom of the first slot is etched to form a first groove, wherein a width of the first groove is greater than a width of the first slot, and the first slot and the first groove form a first word line trench. The selective layer is removed. A first word line is formed in the first word line trench.

In one or more embodiments of the present disclosure, forming the first word line includes following operations. A gate dielectric is conformally formed over the first slot and the first groove. The gate dielectric at a portion between the first slot and the first groove is thickened, so that a first sidewall is formed between the bottom of the first slot and a top of the first groove, wherein the first sidewall is inclined with respect to a horizontal direction.

In some embodiments, the gate dielectric is an oxide layer. Thickening the gate dielectric includes following operations. A portion of the first active area exposed from the first slot is oxidized.

In some embodiments, forming the first word line further includes following operations. A gate structure is formed over the gate dielectric. A dielectric cap is formed in the top portion of the first slot. Forming the gate structure includes following operations. A conductive layer is conformally formed over the gate dielectric. Conductive material is formed over the conductive layer, wherein the conductive material filled with the first groove and the first slot. The conductive layer and the conductive material are recessed from the first slot to expose a top portion of the first slot, wherein the recessed conductive layer and the conductive material form the gate structure.

In one or more embodiments of the present disclosure, a top portion of the first active area is implanted as a source/drain implant region, and a depth of the first slot is less than a depth of the source/drain implant region.

In one or more embodiments of the present disclosure, the method further includes following operations. A second word line is formed across the first active area and the isolation structure. A bit line structure is formed on a portion of the first active area between the first word line and the second word line.

In one or more embodiments of the present disclosure, the method further includes following operations. A third word line is formed across a second active area of the active areas and the isolation structure. A capacitor structure is formed on a portion of the first active area between the first word line and the third word line.

In summary, the memory structure with improved word line structure is able to provide a great landing area, and a corner with thick gate dielectric of the word line structure can improve gate control ability and suppress off state electric field at depletion region to further inhibit GIDL.

It is to be understood that both the foregoing general description and the following detailed description are by examples, and are intended to provide further explanation of the disclosure as claimed.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the disclosure.

FIGS. 2-13A illustrate cross-section views in different stages of forming a memory structure of the present disclosure;

FIG. 13B illustrates a schematic local cross-section view of a word line in

FIG. 13A; and

DETAILED DESCRIPTION

Figure 1A:
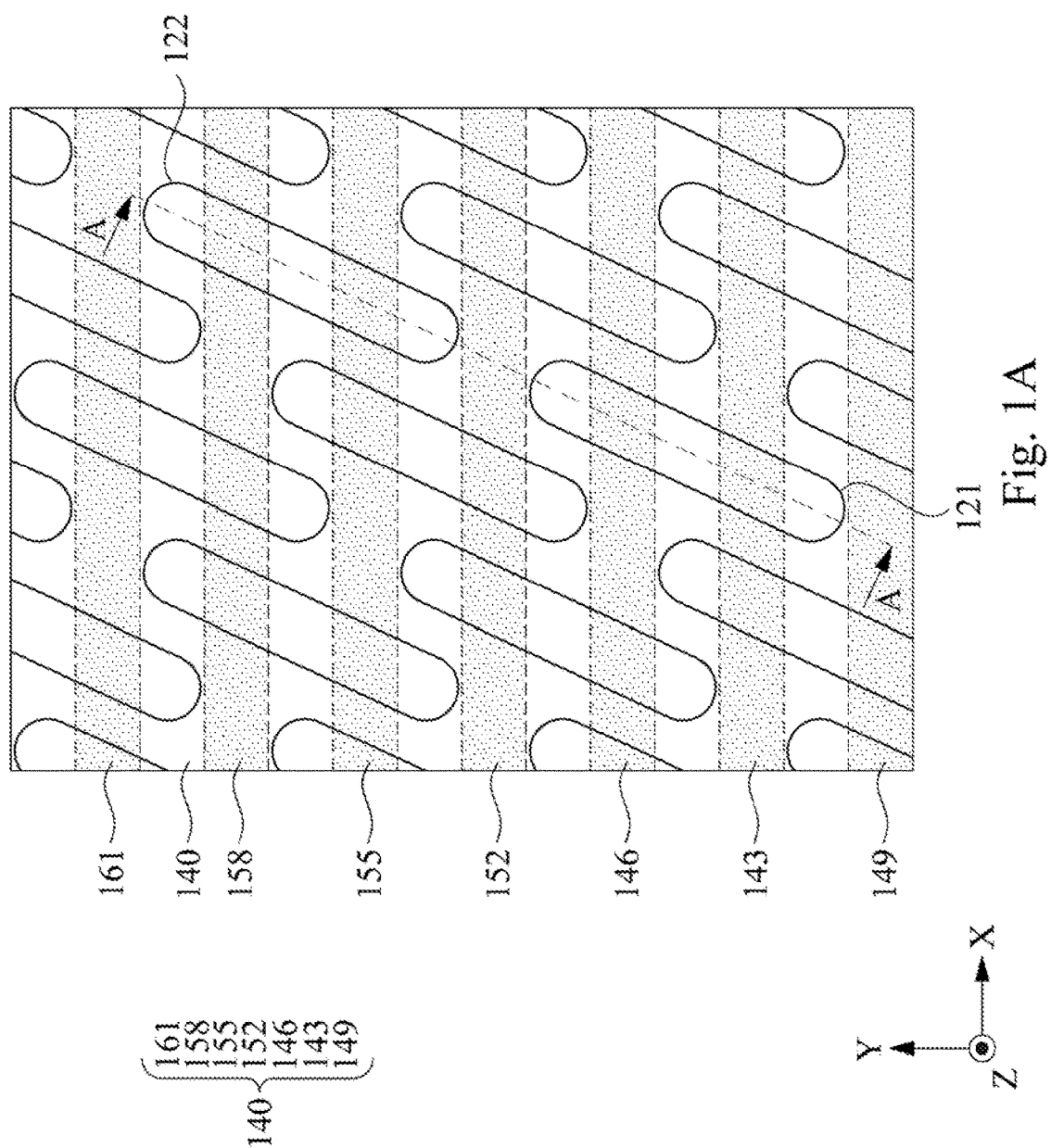
FIG. 1A illustrates a schematic top view of a local of a memory structure of the present disclosure.

Reference will now be made in detail to the embodiments of the present disclosure, examples of which are illustrated in the accompanying drawings. Wherever possible, the same reference numbers are used in the drawings and the description to refer to the same or like parts.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases "first," "second," etc., are solely used to separate the descriptions of elements or operations with same technical terms, not intended to be the meaning of order or to limit the disclosure.

Secondly, phrases "comprising," "includes," "provided," and the like, used in the context are all open-ended terms, i.e. including but not limited to.

Further, in the context, "a" and "the" can be generally referred to one or more unless the context particularly requires. It will be further understood that phrases "comprising," "includes," "provided," and the like, used in the context indicate the characterization, region, integer, step, operation, element and/or component it stated, but not exclude descriptions it stated or additional one or more other characterizations, regions, integers, steps, operations, elements, components and/or groups thereof.

The retention performance of the memory devices is affected by leakage current. The leakage current is caused by, for example, subthreshold leakage, gate induced drain leakage (GIDL), junction leakage and/or cell leakage. Among these current leakage effects, the GIDL is the main contribution for retention performance. For example, high off-state electric field between the gate and the drain of a transistor formed in a memory cell induce worst GIDL and cause worst retention time. In addition, small landing area between the gate and the source or drain of a transistor formed in the memory cell would cause higher contact resistance and unexpected overlap issue, thereby also affecting the retention performance of the memory cell.

In order to improve the retention performance for memory devices, memory structures and methods of forming such memory structures is provided in the present disclosure, and the leakage current caused by high off-state electric field between the gate and the drain of a transistor formed in a memory cell can be reduced and a great landing area can be introduced.

Figure 1B:
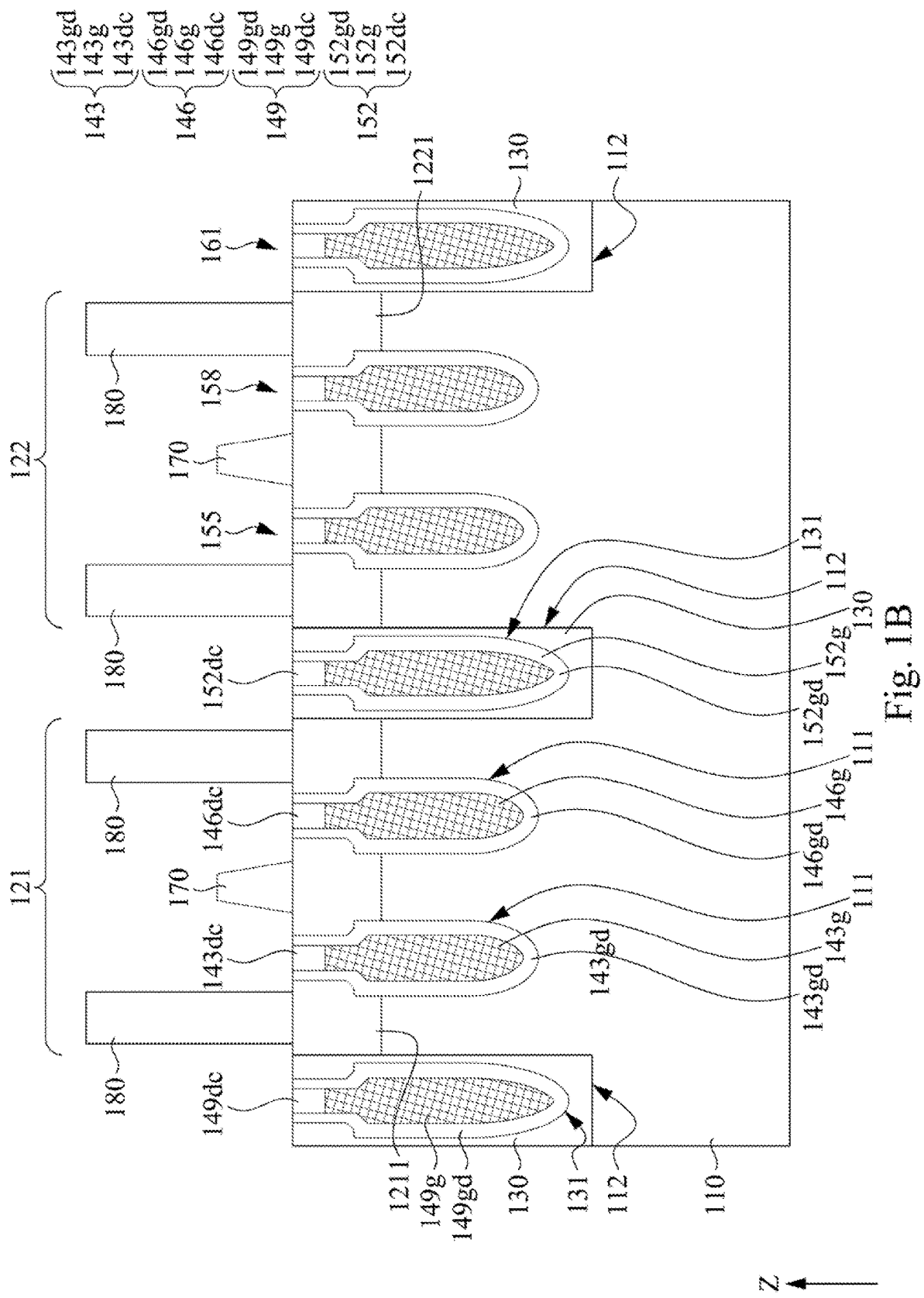
FIG. 1B illustrates a schematic cross-section view along a line A-A of FIG. 1A.

Reference is made by FIGS. 1A and 1B. FIG. 1A illustrates a schematic top view of a local of a memory structure of the present disclosure. FIG. 1B illustrates a schematic cross-section view along a line A-A of FIG. 1A.

In this embodiment, the memory structure 100 includes a substrate 110, a plurality of active areas 120 formed on the substrate 110, an isolation structure 130 formed around the active areas 120 and a plurality of word lines 140 formed over the isolation structure 130 and one or more of the active areas 120. In the local top view of FIG. 1A, the word lines 140 include word lines 143, 146, 149, 152, 155, 158 and 161.

It should be noted that some elements of the memory structure 100 are ignored for the purpose of simple description. For example, bit line structures and capacitors in the memory structure 100 are not shown in FIG. 1A.

FIG. 1B schematically illustrates a cross-section view with the isolation structure 130 and two active areas 121 and 122, wherein two word lines 143 and 146 extends across the active area 121 and two word lines 155 and 158 extends across the active area 122.

In this embodiment, the isolation structure 130 is formed in an isolation trench 131 being recessed from the substrate 110 and surrounding the active areas 120. For example, as shown in FIGS. 1A and 1B, the isolation structure 130 surrounds the active areas 121 and 122, such that the two active areas 121 and 122 are isolated from each other. In other words, the isolation structure 130 formed in the isolation trench 112 defines the active areas 120 such that the active areas 120 are isolated from each other. In the cross-section view of FIG. 1B, the isolation structure 130 is located at two sides of the active area 121 or the active area 122, so that the active areas 121 and 122 are isolated from each other.

In some embodiments, the isolation structure 130 is used as an electric insulator, so as to avoid unexpected leakage current from one of the active areas 120 to other active areas 120. In some embodiments, the isolation structure 130 includes dielectric material deposited in the isolation trench 112. In some embodiments, the isolation structure 130 includes oxide material. The isolation structure 130 can be regarded as, for example, a shallow trench isolation (STI).

Return to FIG. 1A. In this embodiment, the word lines 140 are extended along the direction x. The active areas 120 are arranged along a direction beyond the direction x and a direction y. As shown in FIG. 1A, two word lines 140 are extended through one of the active areas 120. For example, two word lines 143 and 146 are extended over an active area 121 of the active areas 120. Alternatively, two word lines 155 and 158 are extended over an active area 122 of the active areas 120.

In this embodiment, each of the word lines 140 (e.g. word lines 143, 146, 149, 152, 155, 158 and 161) has a bottle-shape on the cross-section view as shown in FIG. 1B. For example, in FIG. 1B, each of the word lines 140 is formed in a corresponding one of word line trenches 111 and 131 recessed from the isolation structure 130 or top surfaces of the active areas 121 and 122. Each of the word line trenches 111 and 131 has a bottle-shape, which is with a narrow slot extended to the top surfaces of the isolation structure 130 or top surfaces of the active areas 121 and 122 and a wide groove expanding from a bottom of the corresponding slot. In other words, only few area of each word line is exposed from the top surface of the isolation structure 130 or the active areas 121 and 122, the occupied areas of the word lines 140 (e.g. word lines 143, 146, 149, 152, 155, 158 and 161) are reduced. Therefore, areas used for landing pads or disposing other structures are increased.

In this embodiment, each of the word lines 140 has a gate dielectric, a gate structure and a dielectric cap covering the gate structure. For example, in FIG. 1B, the word line 143 is formed in a word line trench 111 in the active area 121 and includes a gate dielectric 143$gd$, a gate structure 143$g$ and a dielectric cap 143$dc$. The gate dielectric 143$gd$ is conformally formed over the word line trench 111. The gate structure 143$g$ is formed over the gate dielectric 143$gd$. The dielectric cap 143$dc$ filled in the word line trench 111 and covers the gate structure 143$g$. Similar to the word line 143, the word line 146 includes a gate dielectric 146$gd$, a gate structure 146$g$ and a dielectric cap 146$dc$.

In some embodiments, the gate dielectrics (e.g. gate dielectrics 143$gd$ and 146$gd$) of the word lines 140 are oxide material. In some embodiments, the dielectric cap (e.g. dielectric caps 143$dc$ and 146$dc$) of the word lines 120 are also oxide material. In some embodiments, material of the gate dielectrics (e.g. gate dielectrics 143$gd$ and 146$gd$) is same as the dielectric cap (e.g. dielectric caps 143$dc$, 146$dc$, 149$dc$ and/or 152$dc$).

The word lines 149 and 152 also have structures similar to the word line 143 and 146. In cross-section of FIG. 1B, the word lines 149 and 152 are formed in the word line trenches 131, and, each of the word line trenches 131 extends to the isolation structure 130. A gate dielectric 149$gd$ is formed over the isolation structure 130. A gate structure 149$g$ and a dielectric cap 149$dc$ of the word line 149 are formed over the gate dielectric 149$gd$ within the word line trench 131. Similarly, the word line 152 includes a gate dielectric 152$gd$, a gate structure 152$g$ and a dielectric cap 152$dc$ formed within the word line trench 131.

As shown in FIG. 1B, in this embodiment, the word lines 155 and 158 in the active area 122 have structures similar to the word lines 143 and 146, and the word line 161 have a structure similar to the word lines 149 and 152.

In this embodiment, tops of the substrate 110 are implanted. Specifically, in this embodiment, the substrate 110 is a semiconductor substrate, a top portion of the active area 121 is implanted as a source/drain implant region 1211, and a top portion of the active area 122 is implanted as a source/drain implant region 1221. The source/drain implant regions 1211 and 1221 can be a portion of a transistor in a memory cell used to storage information.

For example, the source/drain implant region 1211 at the top of the active area 121 between the word line 143 and the word line 146, the word line 143 and a portion of the active area 121 between the word line 143 and the isolation structure 130 form a first transistor. The source/drain implant region 1221 at the top of the active area 122 between the word line 143 and the word line 146, and the word line 146 and a portion of the active area 121 between the word line 146 and the structure 130 form a second transistor. The first transistor with the gate structure 143$g$ of the word line 143 and the second transistor with the gate structure 146$g$ of the word line 146 form a common source structure.

In addition, as shown in FIG. 1B, each of the word line trenches has a sidewall inclined with respect to the top surface of the substrate 110. For example, for the word line 143, the gate dielectric 143$gd$ conformally formed over the word line trench 111 has a section inclined with respect to the top surface of the substrate 110 along the sidewall of the word line trench 111. Furthermore, the section of the gate dielectric 143$gd$ at the inclined sidewall of the word line trench 111 has a thickness greater than other sections of the gate dielectric 143$gd$, so that electric field between a gate of a transistor (e.g. the portion of the active area 121 between the word line 143 and the isolation structure 130) and a drain of the transistor (e.g. gate structure 143g in the word line 143) can be reduced and the GIDL effect is improved.

In FIG. 1B, a plurality of bit line structures 170 and a plurality of capacitor structures 180 are formed on the top surfaces of the active areas 121 and 122. Specifically, for the bit line structures 170 and the capacitor structures 180 formed on the active area 121, one of the capacitor structures 180 is formed a portion of the active area 121 between the word line 143 and the word line 149, which extends across another active area 122 and the isolation structure 130 adjacent the active area 121. The bit line structure 170 is formed on a portion of the active area 121 between the word line 143 and the word line 146 in the active area 121. One capacitor structure 180 and one of the transistors in the active area 121 form a 1T1C memory cell connected to a corresponding bit line for a memory device. In some embodiments, the memory device is, for example, DRAM device. The transistor in a memory cell is a structure used to control a storage operation. In some embodiments for a 1T1C memory cell, the capacitor structures 180 are applied with a ground potential and the bit line structure 170 is applied with a charge voltage.

Specifically, one of the capacitor structures 180 is formed a portion of the active area 121 between the word line 143 and the word line 149, which extends across another active area 120 except for the active areas 121 and 122 and the isolation structure 130 adjacent the active area 121. The bit line structure 170 is formed on a portion of the active area 121 between the word line 143 and the word line 146 in the active area 121. One capacitor structure 180 and one of the transistors in the active area 121 form a 1T1C memory cell connected to a corresponding bit line structure 170 for a DRAM device. The transistor in a memory cell is a structure used to control a storage operation. In some embodiments for a 1T1C memory cell, the capacitor structures 180 are applied with a ground potential and the bit line structure 170 is applied with a charge voltage.

In some embodiments, each of the bit line structures 170 includes a bit line contact, which can be a landing pad over the substrate 110, and other further connection structures. In some embodiments, each of the capacitor structures 180 includes a cell contact, which can be a landing pad over the substrate 110, and a capacitor formed on the cell contact. Since the occupied areas of the word lines 140 on the top surface of the substrate 110 is reduced, the landing pad of the bit line structures 170 and the capacitor structures 180 can have great areas for landing, and the unexpected overlap issue is avoided.

Reference is made by FIGS. 2-13B. FIGS. 2-13A illustrate cross-section views in different stages of forming a memory structure of the present disclosure. FIG. 13B illustrates a schematic local cross-section view of a word line in FIG. 13A.

Figure 2:
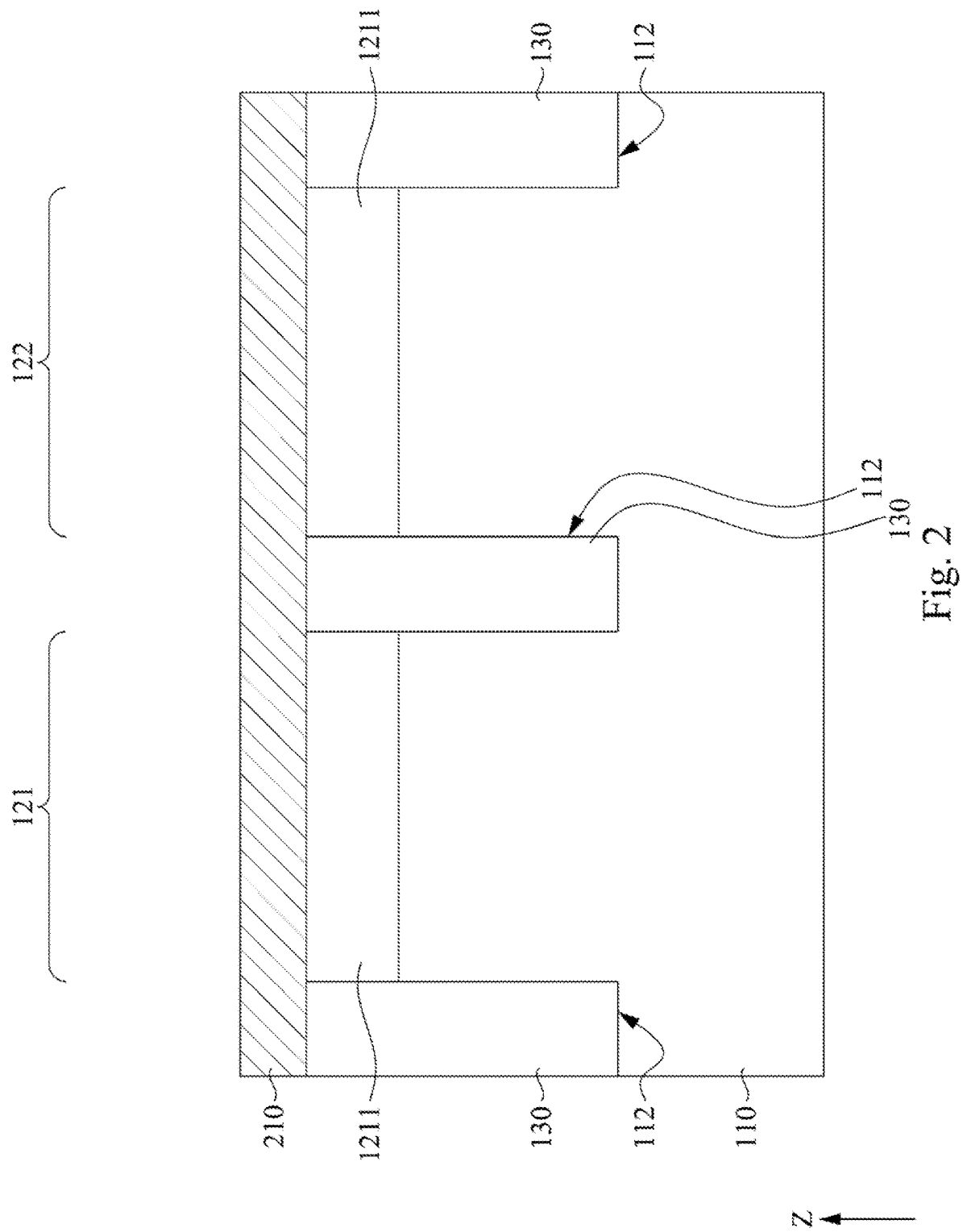

In FIG. 2, a substrate 110 having active areas 121, 122 and an isolation structure 130 surrounding the active areas 121 and 122 is provided. The isolation structure 130 is formed in the isolation trench 112 recessed from the substrate 110.

In this embodiment, a top portion of the active area 121 is implanted as a source/drain implant region 1211, and a top portion of the active area 122 is implanted as a source/drain implant region 1221. As mention above, the source/drain implant regions 1211 and 1221 can be used as a source/drain in the following operations.

Then, a hard mask layer 210 is formed on the active areas 121, 122 and the isolation structure 130 of the substrate 110.

In some embodiments, the hard mask layer 210 is a nitride layer formed over the active areas 121, 122 and the isolation structure 130 of the substrate 110.

Figure 3:
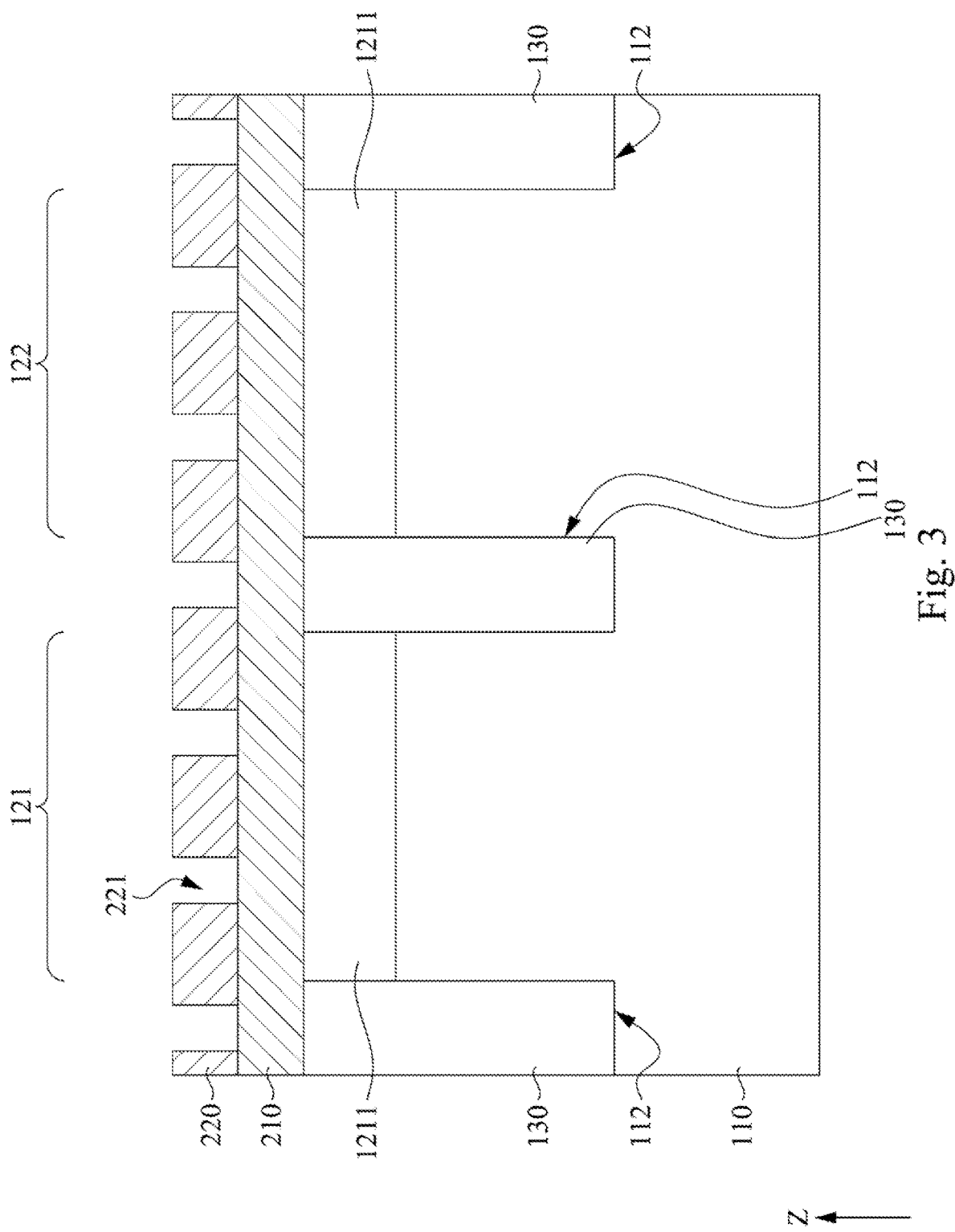

Continued with FIG. 2, in FIG. 3, a photoresist layer 220 is formed on the hard mask layer 210. The photoresist layer 220 is with a pattern having a plurality of slots 221. The slots 221 are used for patterning the hard mask layer 211. In this embodiment, the slots 221 have the same width.

Figure 4:
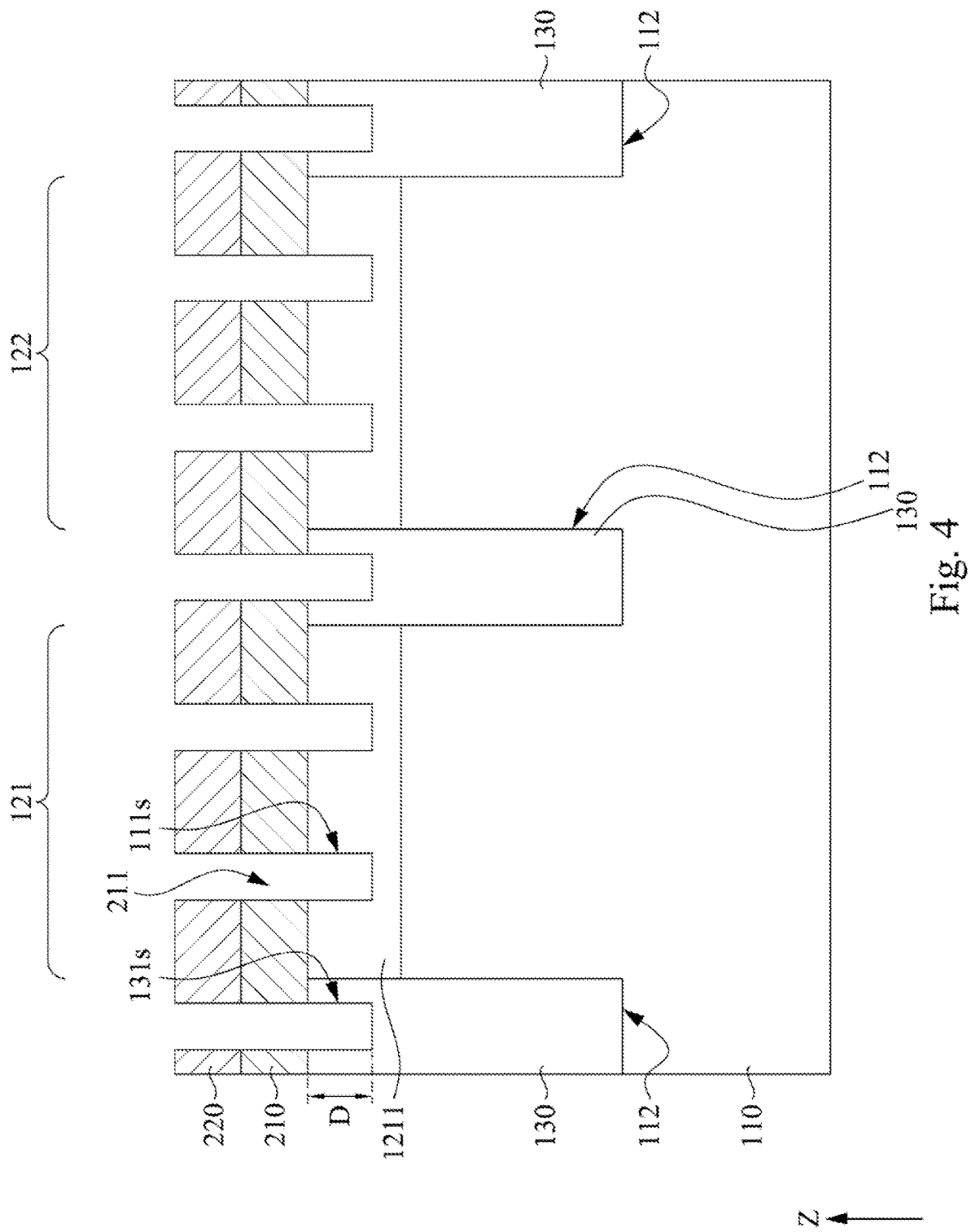

In FIG. 4, the hard mask layer 210 is patterned based on the slots 221 of the photoresist layer 220, and a plurality of patterned trenches 211 are formed in the hard mask layer 210.

After the patterned trenches 211 is formed, the active areas 121, 122 and the isolation structure 130 are etched based on the patterned trenches 211 of the mask layer 210 to form a plurality of slots 111s and 131s recessed from the active areas 121, 122 and the isolation structure 130. In this embodiment, the formed slots 111s and 131s are extended along the direction x and across the isolation structure 130 and one or more active areas 140. As shown in FIG. 4, in this embodiment, each of the slots 111s and 131s has a depth D from the top surface of the substrate 110 or the isolation structure 130 to a bottom itself. In this embodiment, the depth D of the slots 111s and 131s is less than a depth of the source/drain implant region 1211 of the active area 121 or the source/drain implant region 1221 of the active area 122.

Figure 5:
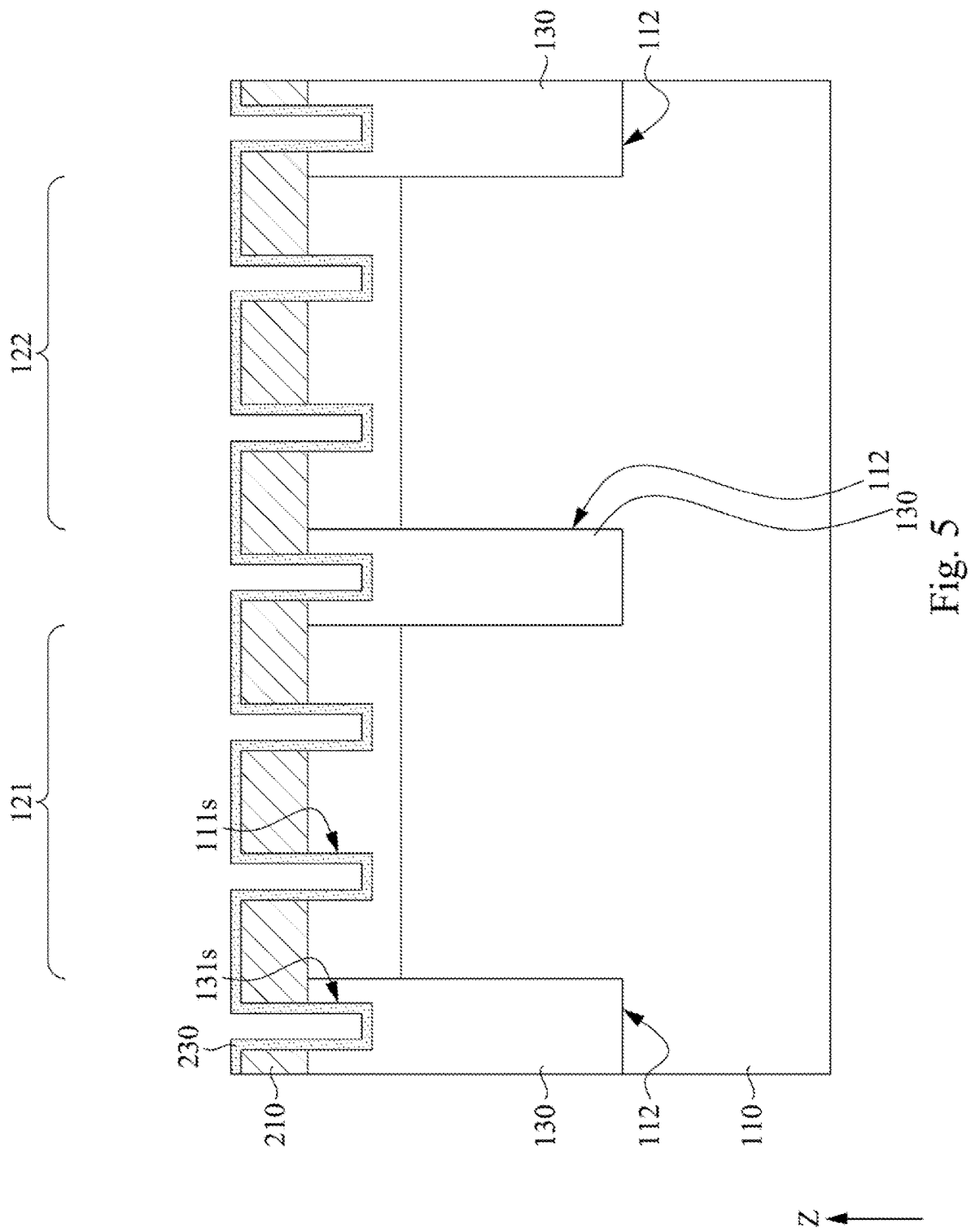

In FIG. 5, after the slots 111s and 131s are formed, the photoresist layer 220 is removed. Then, a selective layer 230 is conformally formed over the hard mask layer 210 and the slots 111s and 131s. In some embodiments, the selective layer 230 is formed by a deposit process. The deposit process used for forming the selective layer 230 includes chemical vapor deposit (CVD) or other suitable deposit process.

Figure 6:
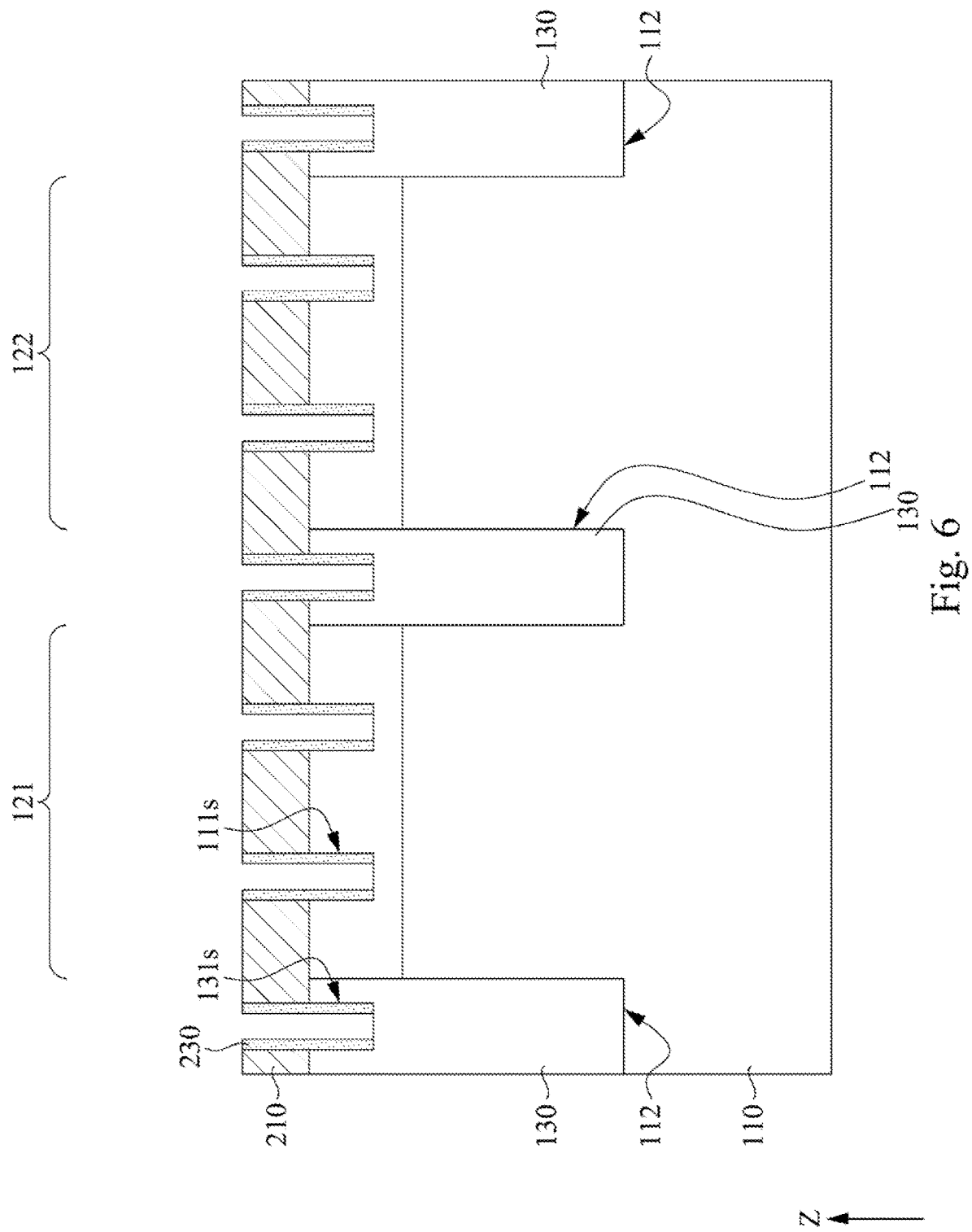

In FIG. 6, the selective layer 230 is etched such that the top surface of the hard mask 210 and the bottoms of the slots 111s and 131s is exposed. In this embodiment, the selective layer 230 is etched by an anisotropic etching process, so that some of the selective layer 230 remains over the sidewalls of the patterned trenches 211 of the hard mask layer 210 and sidewalls of the slots 111s and 131s.

Figure 7:
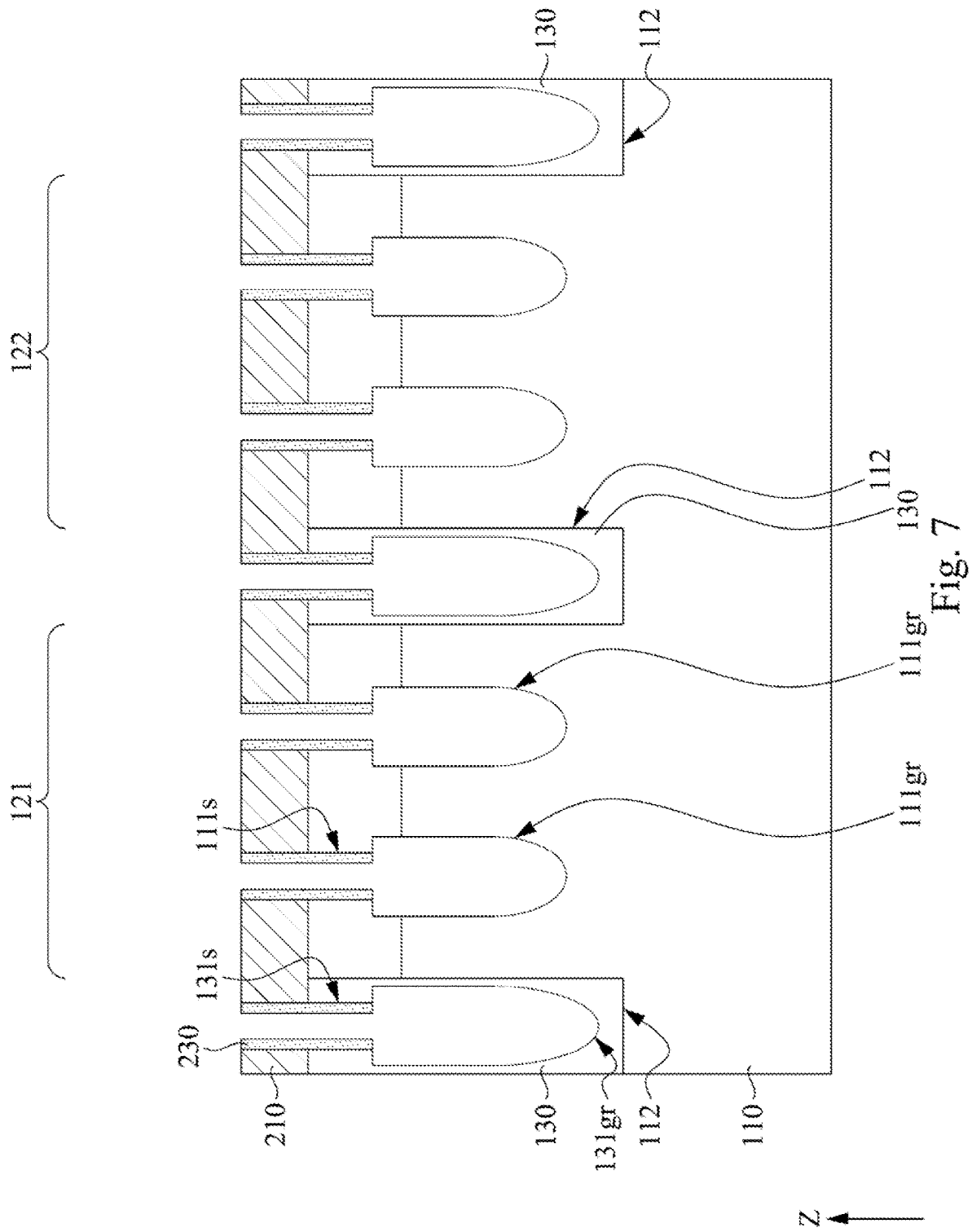

In FIG. 7, a plurality of grooves 111gr are formed and respectively expand from the exposed bottoms of the slots 111s, and a plurality of grooves 131gr are formed and expand from the exposed bottoms of the slots 131s. Each of the grooves 111gr and 131gr are also extended along the direction x and across the isolation structure 130 and one or more active areas 120.

As shown in FIG. 7, since some of the selective layer 230 remains over the sidewalls of the patterned trenches 211 of the hard mask layer 210 and sidewalls of the slots 111s and 131s, the portions of the active area 121, 122 and the isolation structure 130 covered by the selective layer 230 also remains. Beyond the remaining selective layer 230, the grooves 111gr and 131gr further expand from the bottoms of the slots 111s and the 131s respectively, so that each of the groove 111gr has a width greater than a width of the corresponding slot 111s and each of the groove 131gr has a width greater than a width of the corresponding slot 131s.

Figure 8:
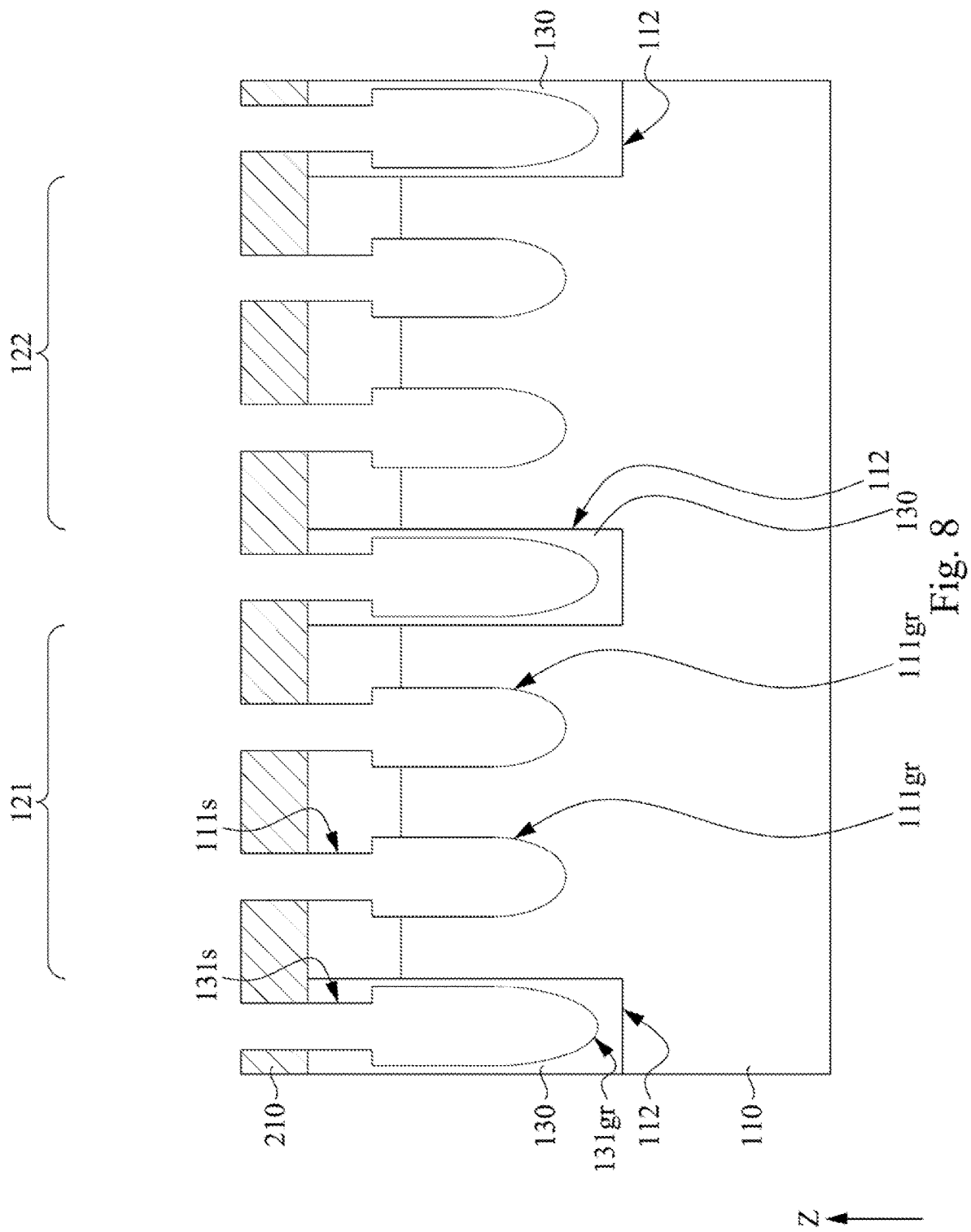

In FIG. 8, the remaining selective layer 230 are removed so that the slots 111s, 131s and the grooves 111gr, 131gr are exposed.

Figure 9:
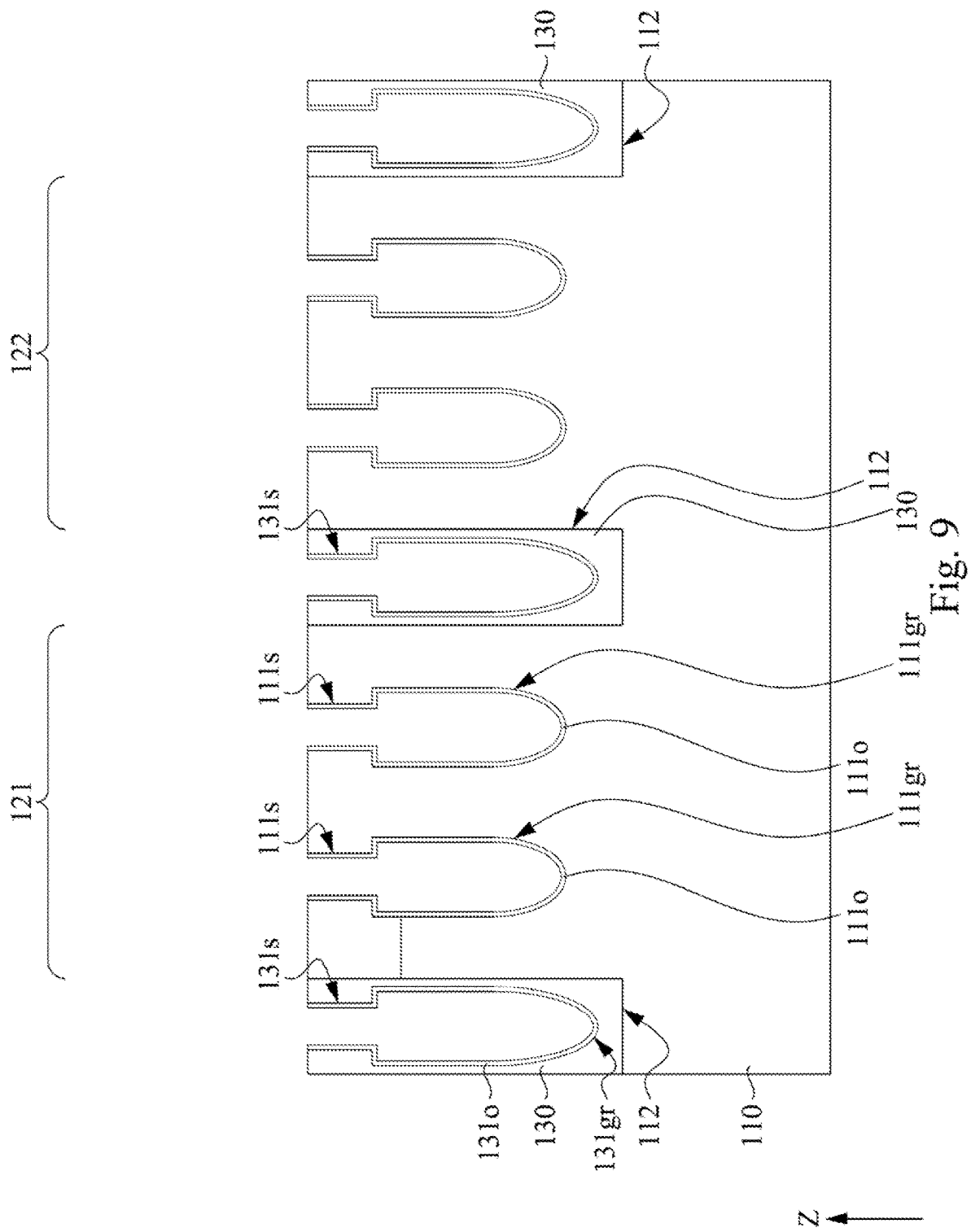

In FIG. 9, after the selective layer 230 is removed, the hard mask layer 210 is removed and oxide layers 1110 and 1310 are respectively formed in the slots 111s, 131s and the grooves 111gr, 131gr. In some embodiments, each of the oxide layers 1110 is conformally formed in the corresponding slot 111s and the corresponding groove 111gr, respectively, and the oxide layers 1310 is conformally formed in the corresponding slot 131s and the corresponding groove 131gr, respectively. In this embodiment, the oxide layers 1110 and 1310 are formed by an oxidation process.

Figure 10:
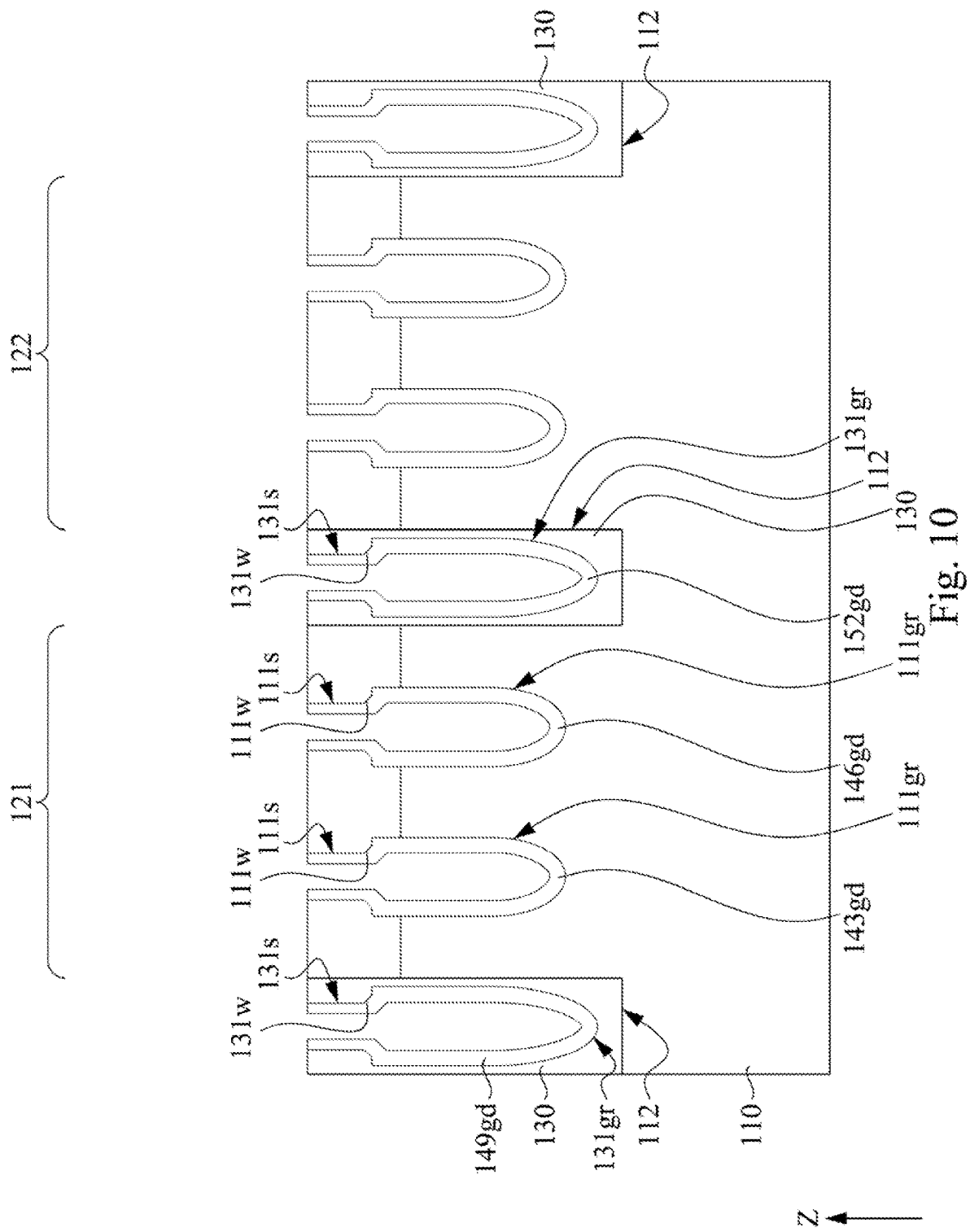

In FIG. 10, the oxide layers 1110 and 1310 are thickened, so that the oxide layers 1110 and 1310 can be used as gate dielectrics formed in the word line trenches 111 and 131.

Please focus on the active area 121 and the region near the active area 121. In this embodiment, the oxide layers 1110 and 1310 are thickened by an oxidation process. Please focus on the oxide layers 111o. After the oxide layers 1110 are formed over the slots 111s and the grooves 111gr, a further oxidation process is performed to oxidize portions of the slots 111s and the grooves 111gr in which the oxide layers 1110 are formed over, so that portions of the slots 111s and the grooves 111gr near the oxide layers 1110 are oxidized as parts of the oxide layers 111o. Therefore, the oxide layers 1110 are thickened as gate dielectrics (e.g. gate dielectrics 143gd and 146gd).

Furthermore, as shown in FIG. 10, the portions connected between the slots 111s and the grooves 111gr and covered by the oxide layers 1110 is reduced, so that sidewalls 111w inclined with respect to the top surface of the substrate 110 are formed. In such embodiments, the slots 111s, the grooves 111gr and the sidewalls connected between the corresponding slots 111s and the corresponding grooves 111gr form the word line trenches 111.

In this embodiment, the sidewalls 111w are formed within the source/drain implant region 1211 and 1221, and the gate dielectrics 143gd and 146gd at the sidewalls 111w include portions of the oxidized material of the source/drain implant region 1211 and 1221.

For the word line 143, since a portion of connected between the slot 111s and the groove 111gr and covered by the oxide layer 1110 are oxidized as portions of the gate dielectric 143gd, the section of the gate dielectric 143gd at the inclined sidewall of the word line trench 111 has a thickness greater than other sections of the gate dielectric 143gd. That is, the gate dielectric 143gd near the source/drain implant region 1211 can have great thickness, so that an off-state electric field near the source/drain implant region 1211 can be inhabited, so the GIDL effect in the memory structure is suppressed.

Alternatively, the gate dielectric 143gd in the groove 111gr under the source/drain implant region 1211 can be designed to have a thin thickness. Since the groove 111gr is used to accumulate a gate structure of a word line, the thin thickness of the gate dielectric 143gd in the groove 111gr can improve gate control ability.

Regarding the word line trench 131 in the isolation structure 130, the oxide layers 1310 can also be thickened by a similar oxidization process such that gate dielectrics 149gd and 152gd with enhanced thickness at corner of the word line trenches 131 are formed. The portions with enhanced thickness of the gate dielectrics 149gd and 152gd includes oxidized material of the isolation structure 130. For details, please refer to following discussion.

In this embodiment, one slot 111s, one groove 111gr and a sidewall 111w connected between the slot 111s and the groove 111gr form a bottle-shape word line trench 111, so that the word line trench has a narrow top extended from the top surface of the substrate 110 and a wide bottom expand within the substrate 110. Since the word line trenches 111 are extended along the direction x, the inclined sidewalls 111w are parallel to the direction x.

Similarly, for one word line trench 131, one slot 131s, one groove 131gr and a sidewall 131w connected between the slot 131s and the groove 131gr form a bottle-shape word line trench 131, so that the word line trench has a narrow top extended from the top surface of the substrate 110 and a wide bottom expand within the substrate 110. The inclined sidewalls 131w are also parallel to the direction x since the word line trenches 131 are extended along the direction x.

The word line trenches 111 in the active area 122 and the word line trench 131 in the isolation structure 130 near the active area can be provided by the same operations, and the oxide layers 1110 over the word line trenches 111 and the oxide layers 1310 over the active area 122 over the word line trench 131 are thickened.

In this embodiment, thickening the oxide layers 1110 and the oxide layers 1310 as the gate dielectrics can be performed in the same process.

Figure 11:
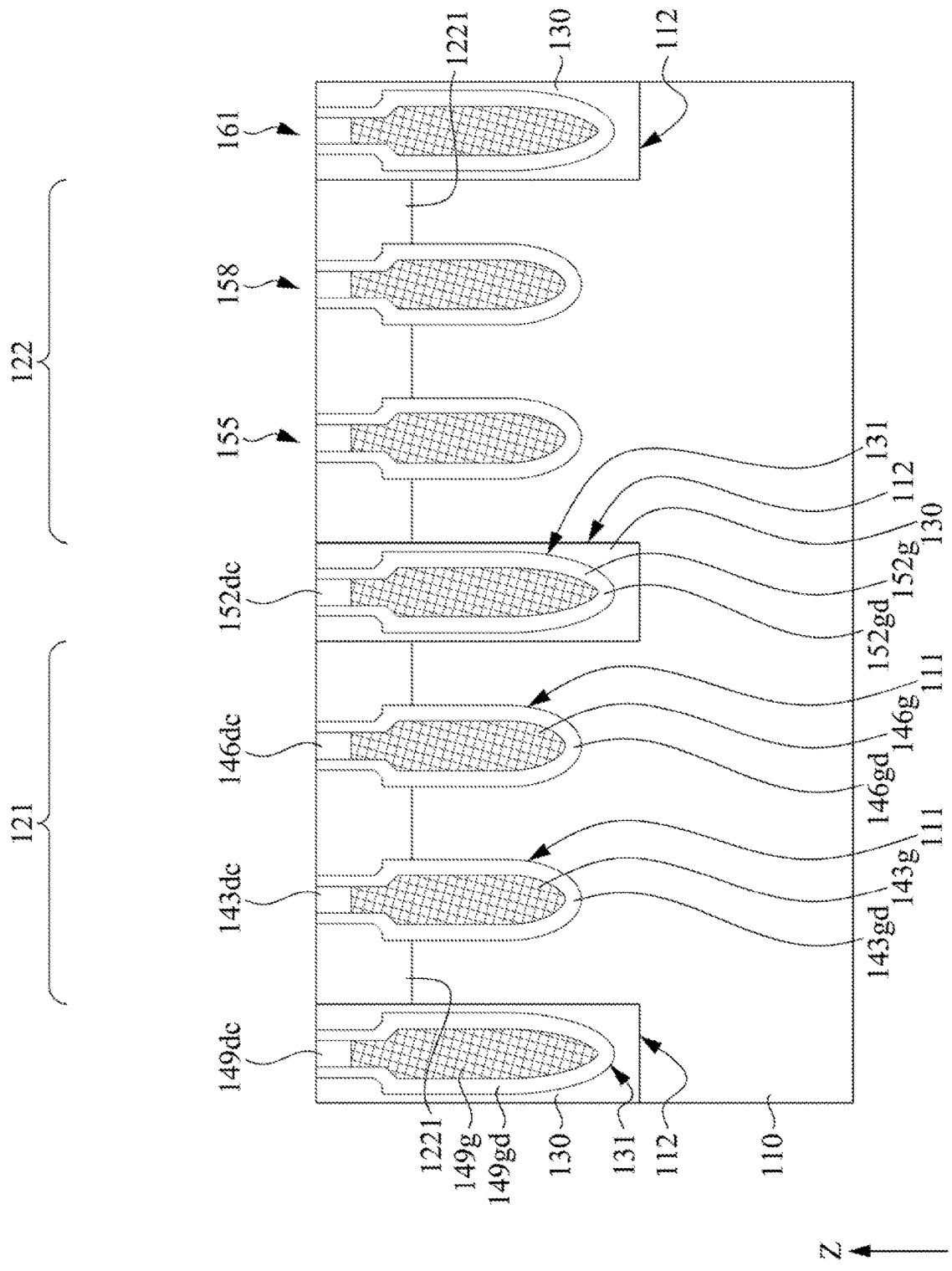

In FIG. 11, a plurality of word lines 140 are formed in the bottle-shape word line trenches 111 and 131.

As mentioned above, the source/drain implant regions 1211 and 1221 can be a portion of a transistor in a memory cell used to storage information. In this embodiment, the source/drain implant region 1211 at the top of the active area 121 between the word line 143 and the word line 146, the word line 143 and a portion of the active area 121 between the word line 143 and the isolation structure 130 form a first transistor. The source/drain implant region 1221 at the top of the active area 122 between the word line 143 and the word line 146, and the word line 146 and a portion of the active area 121 between the word line 146 and the structure 130 form a second transistor. The first transistor with the gate structure 143g of the word line 143 and the second transistor with the gate structure 146g of the word line 146 form a common source structure.

In FIG. 11, gate structures and dielectric cap covering the gate structures are respective formed in the corresponding word line trenches 111 and 131, so that the word lines 143, 146, 149, 152, 155, 158 and 161 are formed.

Please focus on the active area 121. In some embodiments, after the gate dielectrics 143gd, 146gd, 149gd and 152gd are deposited, the gate structures 143g, 146g, 149g and 152g are respectively deposited over the corresponding gate dielectrics 143gd, 146gd, 149gd and 152gd, and the dielectric caps 143dc, 146dc, 149dc and 152dc are deposited over the corresponding gate structures 143g, 146g, 149g and 152g, so that the gate structure 143g, 146g, 149g and 152g are covered by the corresponding dielectric caps 143dc, 146dc, 149dc and 152dc.

In this embodiment, the word lines 155 and 158 in the active area 122 have structures similar to the word lines 143 and 146 and the word line 161 have a structure similar to the word lines 149 and 152. Therefore, the word lines 155, 158 and 161 can be formed by the similar operation as mentioned above.

In some embodiments, a polishing process is performed after the word lines 143, 146, 149, 152, 155, 158 and 161 are formed, so that top surfaces of the word lines 143, 146, 149, 152, 155, 158 and 161 are coplanar.

In some embodiments, material of the gate structures (e.g. gate structures 143g, 146g, 149g and 152g) is conductive material. In some embodiment, the conductive material of the gate structures includes tungsten.

In some embodiments, for each of gate dielectrics, the gate dielectric (e.g. gate dielectric 143gd) in the groove 143gr can be designed to have a thinner thickness with respect to the thickness of the gate dielectric 143gd at the sidewall 111w such that the thickness of the gate dielectric 143gd around the gate structure 143g is less than the thickness of the gate dielectric 143gd at the sidewall 111w, and thin gate dielectric around the gate structure 143g can improve gate control ability to get great on/off ratio.

In some embodiments, the gate structures of the word lines are formed by following operations. For forming one gate structure 143g, a thin conductive layer is conformally formed over the gate dielectric 143gd. The thin conductive layer over the gate dielectric 143gd can form spacing in the corresponding word line trench 111. After the thin conductive layer is formed, conductive material is further formed over the thin conductive layer and filled with space formed by the thin conductive layer in the corresponding word line trench 111, so that the conductive material filled with the first groove 111gr and the first slot 111s of the corresponding word line trench 111. The conductive material and the thin conductive layer form a gate structure 143g of the word line 143. In such case, the thin conductive layer can be regarded as a seed layer.

After the conductive material is filled, the conductive material and the thin conductive layer are recessed from the slot 111s of the corresponding word line trench 111, so that spacing used to accumulate the dielectric cap 143dc covering the gate structure 143g is provided. After the dielectric cap 143dc is deposited over the gate structure 143g, the word line 143 is formed.

Figure 12:
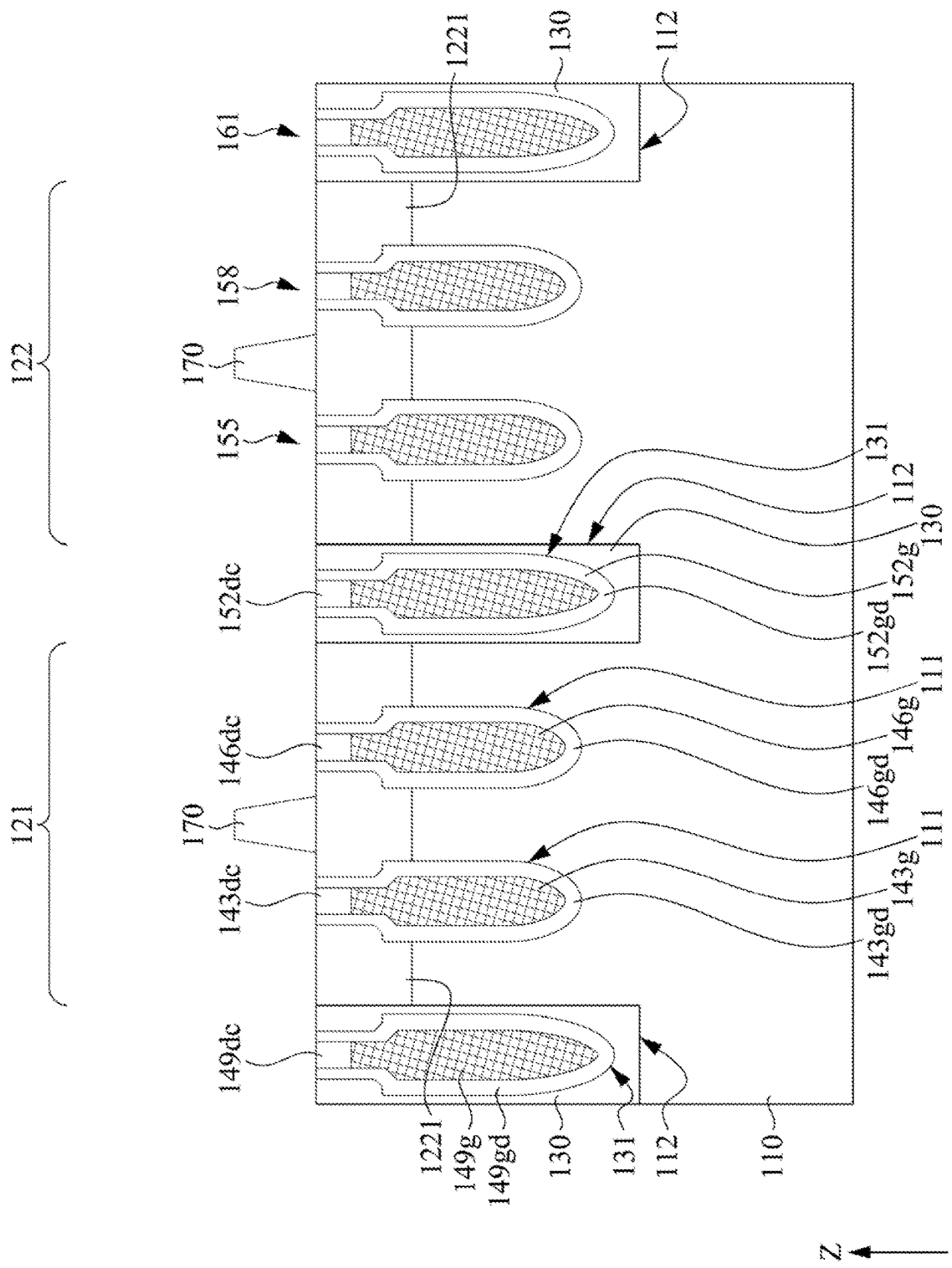

Continued with FIG. 11, in the cross-section view of FIG. 12, a bit line structure 170 is formed on a portion of the active area 121 between the word line 143 and the word line 146, and another bit line structure 170 is formed on a portion of the active area 122 between the word line 155 and the word line 158.

In some embodiments, each of the bit line structures 170 includes a bit line contact, which can be a landing pad over the substrate 110, and other further connection structures.

Figure 13A:
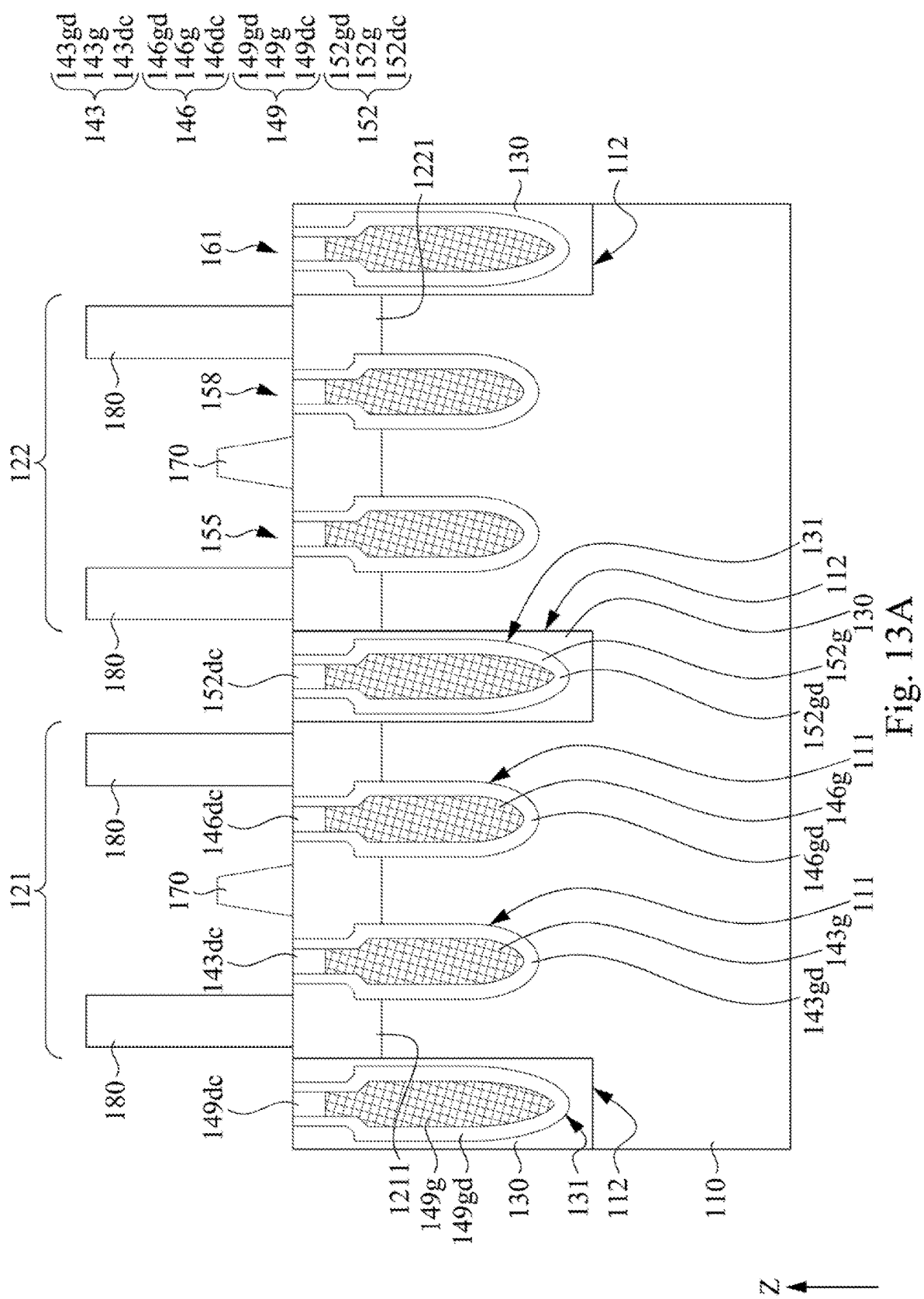
Figure 13B:
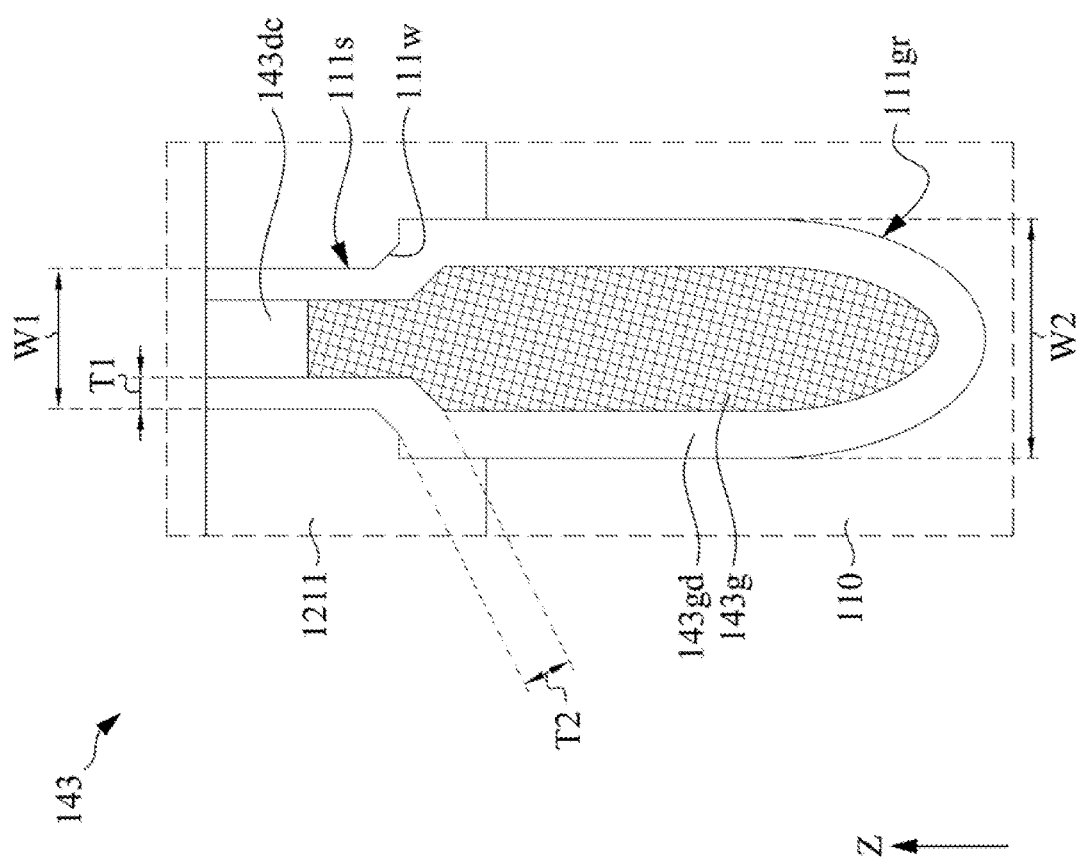

In FIG. 13A, capacitors 180 are formed on the substrate 110. One of the capacitor structures 180 is formed between a portion of the word line 143 and the word line 149, which extends across another active area 122 and the isolation area 125 adjacent the active area 121. As mentioned above, one capacitor structure 180 and one of the transistors in the active area 121 form a 1T1C memory cell connected to a corresponding word line for a DRAM device. The transistor in a memory cell is a structure used to control a storage operation.

In some embodiments, each of the capacitor structures 180 includes a cell contact, which can be a landing pad over the substrate 110, and a capacitor formed on the cell contact.

Since occupied areas of the word lines 140 on the top surface of the substrate 110 are reduced, overlap issue caused by unexpected connection of the bit line structures 170 and the capacitor structures 180 can be avoided. As shown in FIG. 13A, a projection of one of the capacitor structures 180 is able to overlap the gate structure 143g of the word line 143 in the groove 131gr of the word line trench 111.

Reference is made by FIG. 13B. FIG. 13B illustrates a schematic local cross-section view of the word line 143 in FIG. 13A. For the purpose of simple description, some elements are ignored. For example, a portion of the corresponding capacitor structure is not illustrated in FIG. 13B.

As shown in FIG. 13B, in this embodiment, the word line 143 formed in the word line trench 111 has a bottle-shape, which is with a narrow slot 111s, a wide groove 111gr and an inclined sidewall 111w formed between the slot 111s and the groove 111gr. In other words, along a horizontal direction perpendicular to the direction z, the slot 111s has a width W1, the groove 111gr has a width W2, and the width W1 is less than the width W2.

In this embodiment, the gate dielectric 143gd has different sections conformally formed on the slot 111s, the sidewall 111w and the groove 111gr with different thicknesses. In FIG. 13B, the gate dielectric 143gd has a thickness T1 over the slot 111s and a thickness T2 over the inclined sidewall 111w. The thickness T2 is greater than the thickness T1. As mentioned above, in some embodiments, the section of the gate dielectric 143gd over the sidewall 111w can be further thickened, so that the gate dielectric 143gd with the thickened thickness T2 over the sidewall 111s, which is a portion of the source/drain implant region 1211 between the gate structure 143g and the capacitor structure 170 (see FIG. 13A), is able to suppress a GIDL current.

In this embodiment, the section of the gate dielectric 143gd at the groove 111gr has a thickness thinner than the thickness T2. As mentioned above, in some embodiments, the gate dielectric 143gd in the groove 143gr can be designed to have a further thinner thickness with respect to the thickness T2 of the gate dielectric 143gd at the sidewall 111w such that the thickness of the gate dielectric 143gd around the gate structure 143g is less than the thickness of the gate dielectric 143gd at the sidewall 111w. The gate dielectric 143gd with the thin thickness around the gate structure 143g can improve gate control ability to get great on/off ratio.

Figure 14:
FIG. 14 illustrates a flow chart of a method of forming a memory structure of the present disclosure.

Reference is made by FIGS. 2-13B and FIG. 14. FIG. 14 illustrates a flow chart of a method 300 of forming a memory structure of the present disclosure. The method 300 includes operations 301-311, which summarized an example method of forming a memory structure of the present disclosure.

Referring to FIG. 2, in operation 301, a hard mask 210 is formed on active areas 121, 122 and an isolation structure 130 surrounding the active areas 121 and 122 of a substrate 110.

Referring to FIG. 3, in operation 302, a photoresist layer 220 is formed on the hard mask layer 210, wherein the photoresist layer 220 has a pattern used for patterning the hard mask layer 210.

Referring to FIG. 4, in operation 303, the hard mask layer 210 is patterned based on the photoresist layer 220 and the active areas 121 and 122 are etched based on the patterned hard mask layer 210 to form slots 111s and 131s on the active areas 121, 122 and the isolation structure 130.

Referring to FIG. 5, in operation 304, the photoresist layer 220 is removed and a selective layer 230 conformally overlapping the active areas 121 and 122, the isolation structure 130 and the slots 111s and 131s is formed.

Referring to FIG. 6, in operation 305, the selective layer 230 is etched to expose bottoms of the slots 111s and 131s.

Referring to FIG. 7, in operation 306, the active areas 121, 122 and the isolation structure 130 exposed from the bottoms of the slots 111s and 131s are etched to form grooves 111gr and 131gr, wherein each of the grooves 111gr expands from the bottom of the corresponding slot 111s, and each of the grooves 131gr expands from the bottom of the corresponding slot 131s.

Referring to FIG. 8, in operation 307, the selective layer 230 is removed.

Referring to FIG. 9, in operation 308, gate dielectrics (i.e. oxide layers 111o, 131o) are formed in the slots 111s, 131s and the grooves 111gr, 113gr.

Referring to FIG. 10, in operation 309, the gate dielectrics are thickened as gate dielectrics (e.g. 143gd, 146gd, 149gd and 152gd) of the following word lines, respectively, wherein the slots 111s, the grooves 111gr and sidewalls 111w connected between the slots 111s and the grooves 111gr form word line trenches 111 in the active areas 121 and 122, and the slots 131s, the grooves 131gr and sidewalls 131w connected between the slots 131s and the grooves 131gr form word line trenches 131 in the isolation structure 130. Therefore, each of the formed word line trenches 111 and 131 has a bottle-shape with a narrow top and a wide bottom.

Referring to FIG. 11, in operation 310, gate structures (e.g. gate structures 143g, 146g, 149g and 152g) and dielectric caps (e.g. 143g, 146dc, 149dc and 152dc) covering the gate structures are deposited. Therefore, the word lines (e.g. word lines 143, 146, 149, 152, 155, 158 and 161) are formed in the word line trenches 111 and 131.

Referring to FIGS. 12, 13A and 13B, in operation 311, bit line structures 170 and capacitor structures 180 are formed on the substrate 110.

In summary, the memory structure with improved word line structures is provided. One of the improved word line structures has a bottle-shape with a narrow top and a wide bottom, thereby reducing occupied areas of the word lines on a top surface of a substrate and increase areas to be landed for the substrate. In addition, the thickness of the gate dielectric between the narrow top and the wide bottom can be thickened to suppress off state electric field between the gate and the drain. Further, a thin thickness of the gate dielectric around the gate structure of the word line can be provided, thereby improving gate control ability.

Although the embodiments of the present disclosure have been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the embodiments of the present disclosure without departing from the scope or spirit of the present disclosure. In view of the foregoing, it is intended that the present disclosure cover modifications and variations of this invention provided they fall within the scope of the following claims.

What is claimed is:

1. A memory structure, comprising:
a substrate having a plurality of active areas and an isolation structure surrounding the active areas;
a first word line trench recessed from a top surface of the substrate and formed across a first active area of the active areas and the isolation structure, wherein the first word line trench comprises:
a first slot recessed from a top surface of the substrate; and
a first groove expanding from a bottom of the first slot, wherein a first sidewall is connected between the bottom of the first slot and a top of the first groove;
a first word line formed in the first word line trench, wherein the first word line comprises a gate dielectric confomally formed on the first groove and the first slot;
a gate structure over the gate dielectric and in the first groove, wherein the gate structure extends into the first slot and has a top surface lower than a top surface of the substrate; and
a dielectric cap in the first slot and covering the top surface of the gate structure,
wherein a top portion of the first active area is implanted as a source/drain implant region, the source/drain implant region overlaps the first groove of the first word line trench, and the first sidewall of the first word line trench in the first active area is a portion of the source/drain implant region.

2. The memory structure of claim 1, wherein the first sidewall is inclined with respect to a top surface of the substrate.

3. The memory structure of claim 1, wherein a thickness of the gate dielectric on the first sidewall is greater than a thickness of the gate dielectric on the first slot and the first groove.

4. The memory structure of claim 1, further comprising:
a second word line formed across the first active area and the isolation structure; and
a bit line structure formed on a portion of the first active area between the first word line and the second word line.

5. The memory structure of claim 1, further comprising:
a third word line formed across a second active area of the active areas and the isolation structure; and
a capacitor structure formed on a portion of the first active area between the first word line and the third word line.

6. A memory structure, comprising:
a substrate having a plurality of active areas and an isolation structure surrounding the active areas;
a plurality of word line trenches extended along a first direction, each of the word line trenches comprises:
a slot extended from a top surface of the substrate;
a groove expanding from a bottom of the slot; and
a sidewall connected between the bottom of the slot and a top of the groove;
a plurality of word lines, wherein each of the word lines has an extending bottle-shape on a cross-section perpendicular to a first direction in which the word lines extended along, the word lines comprise a first word line, a second word line and a third word line, the first word line and the second word line are formed across a first active area of the active areas and the isolation structure, and the third word line is formed across a second active area of the active areas and the isolation structure, a width of the slot on the cross-section is less than a width of the groove on the cross-section, each of the word lines comprises:
a gate dielectric conformally formed on the slot, the groove and the sidewall of a corresponding one of the word line trenches;
a gate structure over the gate dielectric and in the groove of the corresponding word line trench, wherein the gate structure extends into the slot of the corresponding word line trench and has a top surface lower than a top surface of the substrate;
a dielectric cap in the slot of the corresponding word line trench and covering the top surface of the gate structure; and
a gate dielectric conformally formed on the slot, the groove and the sidewall of a corresponding one of the word line trenches, wherein a thickness of the gate dielectric on the sidewall of the corresponding word line trench is greater than a thickness of the gate dielectric on the slot or the groove of the corresponding word line trench;
a bit line structure formed on a portion of the first active area between the first word line and the second word line; and
a capacitor structure formed on a portion of the first active area between the first word line and the third word line,
wherein the gate dielectrics on the sidewalls of the word line trenches in the active areas comprises oxidized material of the active areas, and the gate dielectrics on the sidewalls of the word line trenches in the isolation structure comprises oxidized material of the isolation structure.

7. The memory structure of claim 6, wherein the sidewalls of the word line trenches are parallel to the first direction and inclined with respect to the top surface of the substrate.

8. A method of forming a memory structure, comprising:
forming a hard mask on a plurality of active areas and an isolation structure surrounding the active areas of a substrate, wherein the hard mask has a first patterned trench extended over a first active area of the active areas and the isolation structure;
etching the first active area and the isolation structure based on the first patterned trench of the hard mask to form a first slot within the first active area and the isolation structure;
forming a selective layer overlapping the active areas, the isolation structure and the first slot;
etching a portion of the selective layer at a bottom of the first slot such that the first active area and the isolation structure at the bottom of the first slot are exposed;
etching the first active area and the isolation structure exposed from the bottom of the first slot to form a first groove, wherein a width of the first groove is greater than a width of the first slot, and the first slot and the first groove form a first word line trench;
removing the selective layer;
forming a first word line in the first word line trench, comprising:
conformally forming a gate dielectric over the first slot and the first groove;
forming a gate structure over the gate dielectric and in the first groove, wherein the gate structure has a top surface lower than a top surface of the substrate; and
forming a dielectric cap in the first slot and covering the top surface of the gate structure; and
implanting a top portion of the first active area as a source/drain implant region, wherein a depth of the first slot is less than a depth of the source/drain implant region.

9. The method of claim 8, further comprising:
forming a second word line across the first active area and the isolation structure; and
forming a bit line structure on a portion of the first active area between the first word line and the second word line.

10. The method of claim 8, further comprising:
forming a third word line across a second active area of the active areas and the isolation structure; and
forming a capacitor structure on a portion of the first active area between the first word line and the third word line.

11. The method of claim 8, wherein forming the first word line comprises:
thickening the gate dielectric at a portion between the first slot and the first groove such that a first sidewall is formed between the bottom of the first slot and a top of the first groove, wherein the first sidewall is inclined with respect to a horizontal direction.

12. The method of claim 11, wherein the gate dielectric is an oxide layer and thickening the gate dielectric comprises:
oxidizing a portion of the first active area exposed from the first slot.

13. The method of claim 11, wherein forming the gate structure comprises:
conformally forming a conductive layer over the gate dielectric; and
forming conductive material over the conductive layer, wherein the first groove and the first slot are filled with the conductive material; and
recessing the conductive layer and the conductive material from the first slot to expose a top portion of the first slot, wherein the recessed conductive layer and the conductive material form the gate structure, and the dielectric cap is formed in the top portion of the first slot.

* * * * *